(12) United States Patent
Kamiya et al.

(10) Patent No.: US 10,778,210 B2
(45) Date of Patent: Sep. 15, 2020

(54) LOAD DRIVER

(71) Applicant: DENSO CORPORATION, Kariya, Aichi-pref. (JP)

(72) Inventors: Yuto Kamiya, Kariya (JP); Shohei Fujita, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/274,596

(22) Filed: Feb. 13, 2019

(65) Prior Publication Data

US 2019/0260372 A1     Aug. 22, 2019

(30) Foreign Application Priority Data

Feb. 21, 2018  (JP) .................................. 2018-28738

(51) Int. Cl.
| | |
|---|---|
| *H03K 17/081* | (2006.01) |
| *H03K 17/0812* | (2006.01) |
| *H03K 17/687* | (2006.01) |
| *F16K 31/06* | (2006.01) |

(52) U.S. Cl.
CPC ... *H03K 17/08104* (2013.01); *F16K 31/0675* (2013.01); *H03K 17/08122* (2013.01); *H03K 17/687* (2013.01)

(58) Field of Classification Search
USPC .................... 327/108–112, 155, 156
See application file for complete search history.

(56) References Cited

U.S. PATENT DOCUMENTS

| | | | | |
|---|---|---|---|---|
| 4,604,675 | A * | 8/1986 | Pflederer | F02D 41/20 123/490 |
| 4,908,731 | A * | 3/1990 | Richeson, Jr. | F01L 1/16 335/234 |
| 5,402,303 | A * | 3/1995 | Luck | H01H 47/325 307/110 |
| 5,717,562 | A * | 2/1998 | Antone | F02D 41/20 361/155 |
| 6,407,593 | B1 * | 6/2002 | Kawamoto | F02D 41/20 327/110 |
| 6,657,846 | B1 * | 12/2003 | Philipp | F02D 41/20 123/490 |
| 7,295,417 | B2 * | 11/2007 | Kotwicki | F01L 9/04 361/156 |
| 7,823,860 | B2 * | 11/2010 | Ueda | F02D 41/20 251/129.04 |
| 9,777,667 | B2 * | 10/2017 | Fukuda | F02D 41/20 |
| 9,822,745 | B2 * | 11/2017 | Akiyama | F02M 51/061 |

(Continued)

FOREIGN PATENT DOCUMENTS

| | | |
|---|---|---|
| JP | 2013-204442 A | 10/2013 |
| JP | 2013-251975 A | 12/2013 |

*Primary Examiner* — Adam D Houston
(74) *Attorney, Agent, or Firm* — Posz Law Group, PLC (57) ABSTRACT

A load driving device supplies power to drive a solenoid valve from a high-voltage power source via a discharge MOSFET or from a direct current power source via a constant-current MOSFET. A return current flows through a reflux MOSFET. A control circuit determines an operation state of the reflux MOSFET by detecting a drain voltage of the reflux MOSFET as a detection voltage. When the reflux MOSFET does not turn ON due to a gate-ground fault, the return current flows through a parasitic diode and the control circuit can determine such a fault based on the detection voltage.

9 Claims, 9 Drawing Sheets

(56) References Cited

U.S. PATENT DOCUMENTS

| | | | | |
|---|---|---|---|---|
| 2008/0319699 | A1* | 12/2008 | Perryman | F02D 41/221 |
| | | | | 702/115 |
| 2010/0299051 | A1* | 11/2010 | Wang | F02D 35/023 |
| | | | | 701/111 |
| 2011/0133711 | A1* | 6/2011 | Murakami | H03K 17/0822 |
| | | | | 323/282 |
| 2011/0149457 | A1* | 6/2011 | Lopez Pamplona | F04B 49/03 |
| | | | | 361/156 |
| 2012/0079832 | A1* | 4/2012 | Benitah | F01D 21/003 |
| | | | | 60/802 |
| 2012/0175876 | A1* | 7/2012 | Pendray | H02P 9/04 |
| | | | | 290/41 |
| 2012/0194226 | A1* | 8/2012 | Itou | H03K 17/168 |
| | | | | 327/109 |
| 2014/0012484 | A1* | 1/2014 | Love | F02D 41/221 |
| | | | | 701/103 |
| 2015/0085894 | A1* | 3/2015 | Yang | F02D 29/02 |
| | | | | 374/4 |
| 2015/0106040 | A1* | 4/2015 | Methil | F02D 41/1477 |
| | | | | 702/51 |
| 2015/0354522 | A1* | 12/2015 | Hoban, Jr. | G01R 31/50 |
| | | | | 73/114.45 |
| 2016/0265498 | A1* | 9/2016 | Puckett | F02D 41/20 |
| 2017/0237381 | A1* | 8/2017 | Shinohara | H02P 29/0241 |
| | | | | 318/400.27 |
| 2017/0365997 | A1* | 12/2017 | Kitamoto | H02H 3/08 |
| 2019/0032509 | A1* | 1/2019 | Muldal | F02C 9/34 |
| 2019/0097561 | A1* | 3/2019 | Sato | H02M 7/48 |
| 2019/0109534 | A1* | 4/2019 | Okonogi | F02D 41/3064 |
| 2019/0165611 | A1* | 5/2019 | Miyazawa | H02M 3/335 |
| 2019/0260372 | A1* | 8/2019 | Kamiya | H03K 17/0822 |

* cited by examiner

LOAD DRIVER

CROSS REFERENCE TO RELATED APPLICATION

The present application is based on and claims the benefit of priority of Japanese Patent Application No. 2018-028738, filed on Feb. 21, 2018, the disclosure of which is incorporated herein by reference.

TECHNICAL FIELD

The present disclosure relates to a load driver or a load driving device for driving an electrical load.

BACKGROUND INFORMATION

Load drivers for driving an electrical load may be configured as control circuits having small volumes and high functionality, yet be subject problems. As such, load drivers are subject to improvement.

SUMMARY

The present disclosure describes a load driver that is capable of monitoring a gate terminal potential without increasing the number of terminals of its control section.

BRIEF DESCRIPTION OF THE DRAWINGS

Objects, features, and advantages of the present disclosure will become more apparent from the following detailed description made with reference to the accompanying drawings, in which.

DETAILED DESCRIPTION

Load drivers for driving an electrical load may be configured as control circuits having small volumes and high functionality, yet be subject to heat generation problems.

Specifically, a large amount of heat may be generated from a driver device for driving a fuel injector in a vehicle. By driving a load such as an electromagnetic valve or a solenoid valve, the driver may generate heat from a diode that serves as a supply current path and a regeneration current path. Consequently, the diode may be replaced by a switching element such as MOSFET to implement a synchronously-commutated method of current supply.

However, the synchronously-commutated current supply method using a switching element having three terminals such as a MOSFET may detect a ground fault abnormality at a gate terminal of the switching element by monitoring the gate terminal potential. Such monitoring increases the cost of the load driver by requiring an extra, monitor terminal (i.e., an extra pin) in a load driver integrated circuit (IC). As such, load drivers are subject to improvement.

In an aspect of the present disclosure, a load driver may be of a synchronous-commutated type, which is configured to supply an electric current to an electro-magnetic valve by an ON-OFF drive of (i) a gate-drive type first switching element for a power supply, and (ii) a gate-drive type second switching element for a return current (i.e., reflux current, or more simply, reflux) under the control of a control circuit. The load driver may include the first switching element, the second switching element, and the control circuit for such an ON-OFF drive of the first and second switching elements. The control circuit of the load driver may determine a gate ground fault of the second switching element when an inter-terminal voltage of the second switching element at a time of a gate-ON drive of the second switching element is equal to or lower than a threshold voltage that is set to be lower than a normal gate-ON drive time.

According to the above configuration, the load driver implementing the synchronously-commutated method may allow a return current generated in the electromagnetic valve to flow by an ON drive of the second switching element after an ON drive of the first switching element. The load driver may enable its control circuit to determine the gate ground fault of the second switching element by detecting that the inter-terminal voltage of the second switching element at the gate-ON drive time is equal to or lower than the threshold voltage that is set to be lower than a normal gate-ON drive time. Consequently, such configuration requires no additional terminal in the control circuit for the determination of the gate ground fault of the second switching element.

First Embodiment

Figure 1:
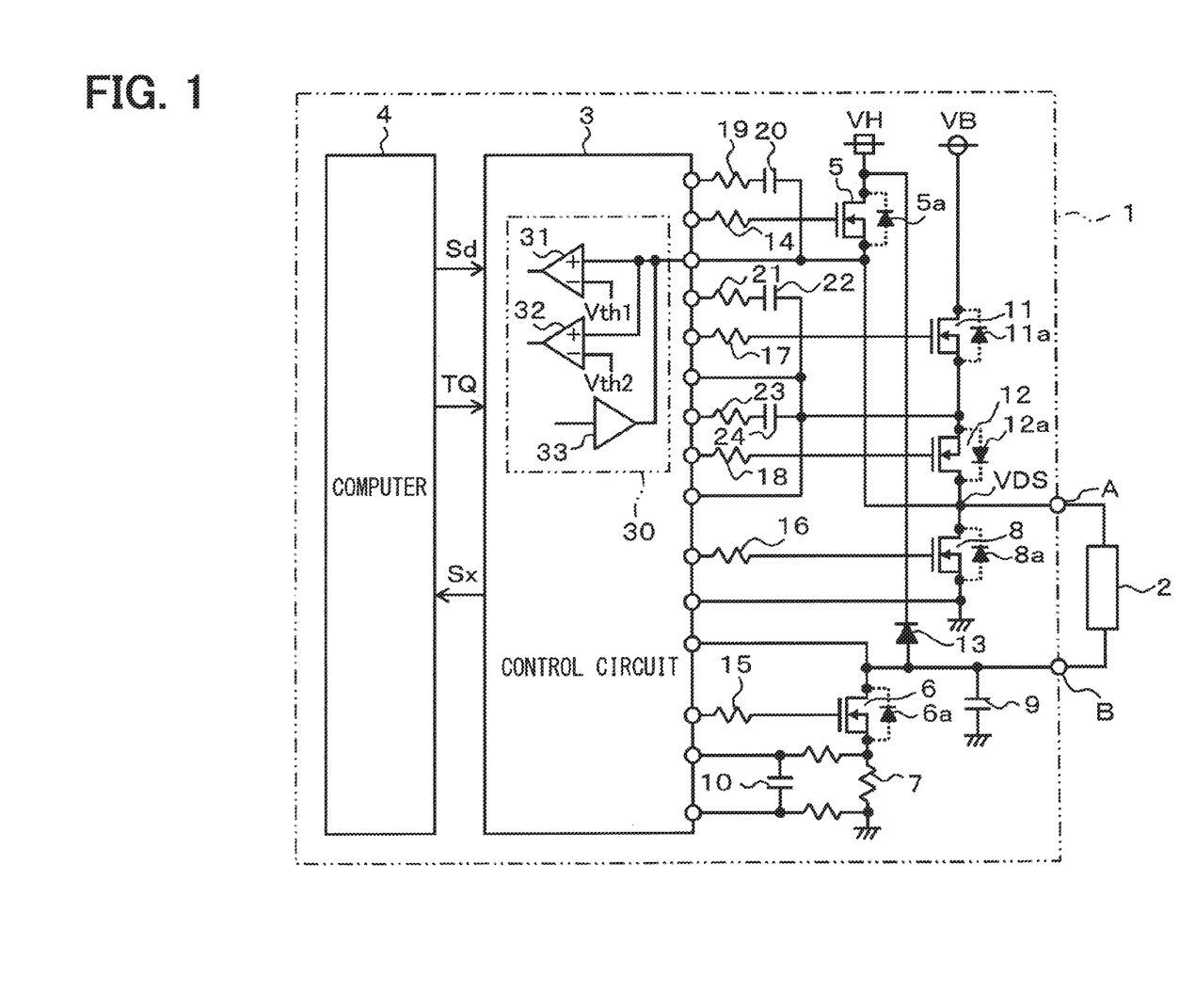
FIG. 1 is a schematic diagram of a load driver in a first embodiment of the present disclosure.

The first embodiment of the present disclosure is described with reference to FIGS. 1, 2, 3, 4, and 5. FIG. 1 shows an electrical configuration of a load driving device 1 for injecting fuel to an internal-combustion engine. The load driving device 1 drives an electromagnetic valve 2 (e.g., a solenoid valve 2) that is an inductive load.

The load driving device 1 is driven and controlled by the control circuit 3 that operates according to instructions from a computer 4. The computer 4 may be a small-sized computer such as a microcontroller or a system on a chip (SoC). The computer 4 may include one or more CPUs (i.e., processor cores); memory such as RAM, ROM, flash; and input/output (I/O) (all not shown). The memory may be used to store a program/instruction set and the memory is an example of a substantive, non-transitory computer readable medium. The one or more CPUs of the computer 4 may execute a program/instruction set stored in memory to instruct the control circuit 3 for performing the processes described in greater detail below associated with the control circuit 3. For example, executing by the program(s) stored in the memory of the computer 4 may cause the control circuit 3 to perform the processes, for example, associated with the process flow diagrams shown in FIGS. 2 and 3 (as well as in FIGS. 6, 7, and 9 in the other embodiments). The control circuit 3 may also contain its own computing device (not shown) for performing the processes associated with the control circuit 3. Alternatively, the computer 4 may be included in the control circuit 3.

Two terminals of the solenoid valve 2 are respectively connected to the load driving device at output terminals A and B of the load driving device 1.

Electric power, also referred to simply as "power" throughout the description, is supplied from two power sources for driving the solenoid valve 2. That is, power may be supplied from both a direct current (DC) power source VB connected to a positive electrode terminal of an in-vehicle battery and a high voltage power source VH that is boosted from the direct current power source VB via a booster circuit. The DC power source may also be, for example, the vehicle battery itself.

The high voltage power source VH is connected to the output terminal A via a switching element 5. The switching element 5 may be a metal-oxide-semiconductor field-effect transistor and also be referred to as a discharge MOS 5. The discharge MOS 5 may be implemented as an N-channel or n-type MOSFET. The output terminal B is connected to ground (e.g., a return path) via a switching element 6 and a resistor 7 connected in series. The switching element 6 may be referred to as a cylinder MOS 6 and be implemented as an n-type MOSFET. Built-in parasitic diodes 5a and 6a are respectively incorporated in the discharge MOS 5 and the cylinder MOS 6.

The output terminal A is connected to ground via a switching element 8. The switching element 8 may be referred to as a reflux MOS 8 and be implemented as an N-channel type MOSFET. The reflux MOS 8 incorporates a built-in parasitic diode 8a. A capacitor 9 is connected at a position between the output terminal B and the ground. A capacitor 10 is connected in parallel with the resistor 7.

The DC power source VB is connected to the output terminal A via a series connection of switching elements 11 and 12. The switching element 11 may be referred to as a constant-current MOS 11 and be implemented as an n-type MOSFET. The switching element 12 may be referred to as a backflow prevention MOS 12 and be implemented as an N-channel type MOSFET. The constant-current MOS 11 and the backflow prevention MOS 12 have their sources connected to each other. Built-in parasitic diodes 11a and 12a are respectively incorporated into the constant-current MOS 11 and the backflow prevention MOS 12. A diode 13 is connected in a forward direction from the output terminal B to the high voltage power source VH. That is, the anode of the diode 13 is connected to the output terminal B and the cathode of the diode 13 is connected to the high voltage power source VH.

In the above-described configuration, the discharge MOS 5 and the constant-current MOS 11 respectively function as a first switching element, where the discharge MOS 5 functions as a high-voltage switching element and the constant-current MOS 11 functions as a normal switching element. The reflux MOS 8 functions as a second switching element.

The discharge MOS 5, cylinder MOS 6, reflux MOS 8, constant-current MOS 11, and the backflow prevention MOS 12 are gate-drive type switching elements.

The gate of the discharge MOS 5 is connected to the control circuit 3 via a resistor 14, and the gate of the cylinder MOS 6 is connected to the control circuit 3 via a resistor 15. The control circuit 3 drives the discharge MOS 5 and the cylinder MOS 6 to supply power from the high voltage power source VH to the solenoid valve 2. The gate of the reflux MOS 8 is connected to the control circuit 3 via a resistor 16. The control circuit 3 drives the cylinder MOS 6 and the reflux MOS 8 to effectuate the flow of a return current from the solenoid valve 2.

The gate of the constant-current MOS 11 is connected to the control circuit 3 via a resistor 17, and the gate of the backflow prevention MOS 12 is connected to the control circuit 3 via a resistor 18. The control circuit 3 drives the constant-current MOS 11, the backflow prevention MOS 12, and the cylinder MOS 6 to supply power from the DC power source VB. When power is supplied from the high-voltage power source VH to the solenoid valve 2, the control circuit 3 holds the backflow prevention MOS 12 in an OFF state to prevent the flow of current to or toward the DC power source VB.

The source of the discharge MOS 5 is directly connected to the control circuit 3 and is also connected to the control circuit 3 via a resistor 19 and a capacitor 20 in series. Both the source of the constant-current MOS 11 and the backflow prevention MOS 12, collectively referred to as the "common" source, are connected directly to the control circuit 3. The common source is also connected to the control circuit 3 via a resistor 21 and a capacitor 22 in series, and via a resistor 23 and a capacitor 24 connected in series. The three series circuits including the resistor and the capacitor (e.g., 19 and 20; 21 and 22; and 23 and 24) respectively form a bootstrap circuit and are used for maintaining an ON state of the discharge MOS 5 and the constant-current MOS 11.

The control circuit 3 is internally provided with a fault detection circuit 30. The fault detection circuit 30 includes a first comparator 31 for fault detection, a second comparator 32, and a bias power source 33. The fault detection circuit 30 is configured to detect a detection voltage VDS of the drain terminal (e.g., at the output terminal A) of the reflux MOS 8 for operating the MOS 8 as a reflux MOS.

In the first comparator 31 and the second comparator 32, the detection voltage VDS is input to non-inverted input terminals. The first threshold voltage Vth1 is input to the inverted terminal of the first comparator 31 and the second threshold voltage Vth2 is input to the inverted terminal of the second comparator 32. The first comparator 31 is provided for determining an overcurrent by comparing a sample, for example, the detection voltage, with the first threshold voltage Vth1, which is an overcurrent detection voltage. The second comparator 32 compares the detection voltage VDS with the second threshold voltage Vth2 for gate-ground fault detection. The bias power source 33 applies a reference voltage Vs (e.g., 2.5 V) to the drain of the reflux MOS 8.

The operation of the above-described configuration is described with reference to FIGS. 2 to 5. When a drive signal TQ is provided from the computer 4, the control circuit 3 of the load driving device 1 performs a power supply control for fuel injection to the solenoid valve 2 and performs a valve opening operation. In such a case, as shown at (a) in FIG. 4, when the drive signal TQ is turned ON at time t0, the control circuit 3 begins to drive the cylinder MOS 6 to ON at time t1, as shown in FIG. 4 at (e), and then begins to drive the discharge MOS 5 to ON shortly after time t1, as shown at FIG. 4 at (c).

As a result of the above-described power supply control, with reference again to FIG. 1, a current path is formed as a power supply path from the high-voltage power source VH through the discharge MOS 5, the solenoid valve 2, the cylinder MOS 6, and the resistor 7 to energize the solenoid valve 2.

The high-voltage power source VH supplies power to feed the solenoid valve 2 by discharging an accumulated charge from a boosting capacitor. Consequently, as shown in FIG. 4 at (b), the solenoid valve 2 receives a flow of load current Id that gradually increases starting at time t2. At time t3, the solenoid valve 2 is driven to a predetermined position. In other words during a power supply cycle for supplying electric power to the electromagnetic solenoid valve 2, the control circuit 3 may drive the discharge MOS 5 (i.e., the high-voltage switching element) to ON for a preset period Ton1 from time t2 to t3 to provide power from the high voltage power source VH.

Figure 4:
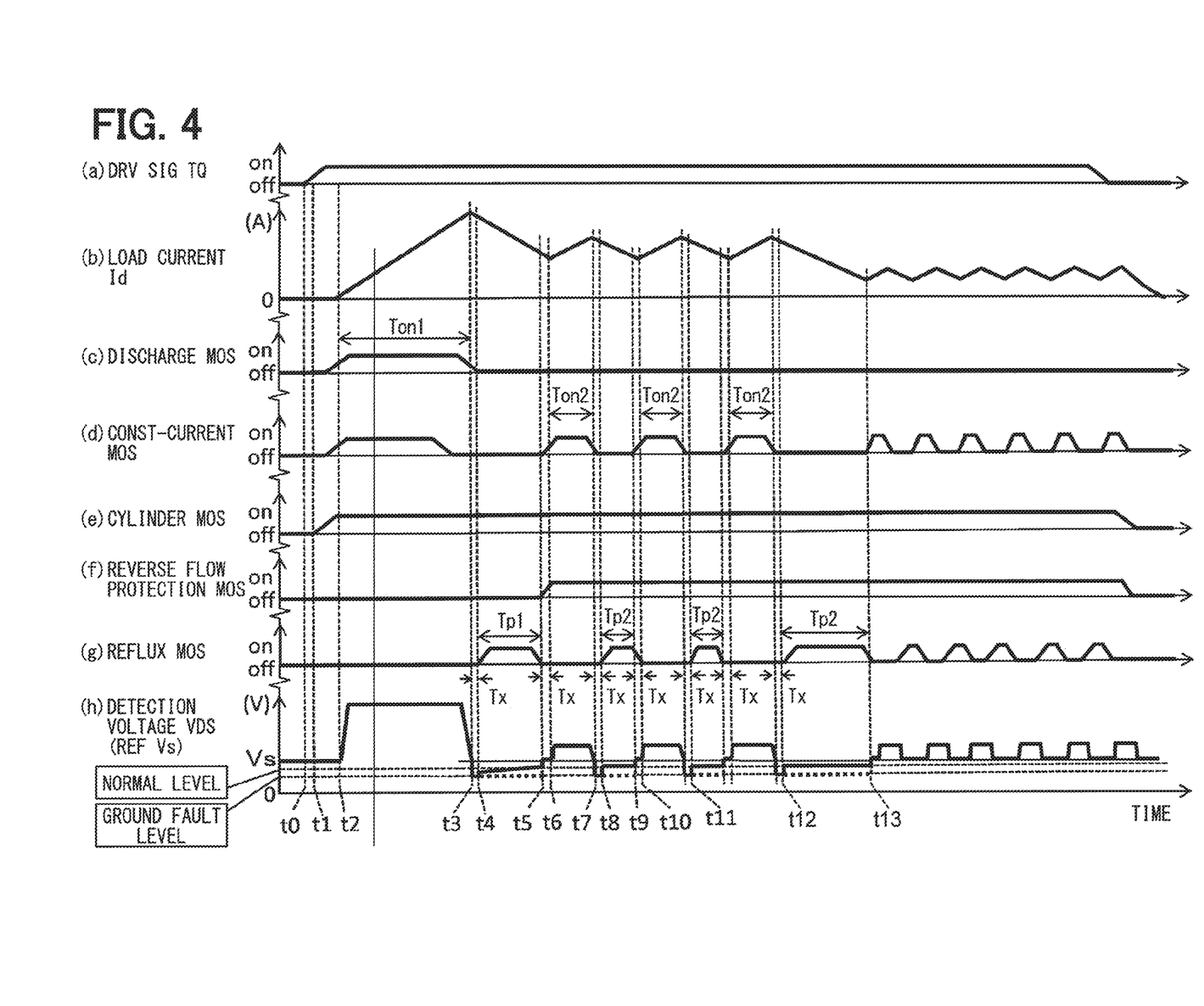
FIG. 4 is a timing chart of the operation of the load driver.

As shown in FIG. 4 at (d), the control circuit 3 also drives the constant-current MOS 11 to ON. When the power supply operation is performed from the high voltage power source VH, the output terminal A is at an electric potential close to the voltage of the high voltage power source VH even when the constant-current MOS 11 is turned ON. In such a case, no power is supplied from the DC power source VB and a reflux or return current is prevented from flowing back to the DC power source VB by the backflow prevention MOS 12.

In the ON state of the discharge MOS 5, the electric potential of the output terminal A is raised to be substantially the same voltage of the high voltage power source VH. As shown in FIG. 4 at (h), such a high voltage is significantly higher than the reference potential Vs.

When an ON period Ton1 from time t2 to time t3 of the discharge MOS 5 has elapsed, the control circuit 3 turns OFF the discharge MOS 5. As a result, the load current Id flowing through the solenoid valve 2 stops due to an interruption of the power supply from the high voltage power source VH. After the discharge MOS 5 is turned OFF, since the solenoid valve 2 is inductive, the load current Id flows from the ground via the diode 8a of the reflux MOS 8 in the OFF state. When the load current Id flows through the diode 8a, the detection voltage VDS at the output terminal A lowers to an electric potential lower than the ground potential by a forward voltage Vf (=0.7 V) of the diode 8a.

At time t4, after a dead time Tx elapses from turning OFF the discharge MOS 5, the control circuit 3 turns ON the reflux MOS 8 as shown in FIG. 4 at (g). As a result of turning ON the reflux MOS 8, with reference to FIG. 5, a current path shown by the dotted line originates from the ground via the reflux MOS 8, the solenoid valve 2, the cylinder MOS 6, and the resistor 7. Consequently, as shown in FIG. 4 at (b), the solenoid valve 2 has the load current Id continuously flowing through the solenoid valve 2 as a return current.

The detection voltage VDS at the output terminal A (i.e., the drain-source voltage Vds of the reflux MOS 8) becomes a negative voltage that is lower than the ground level by the amount of voltage of the ON state reflux MOS 8, that is, by the drain-source voltage Vds. The drain-source voltage Vds of the reflux MOS 8 may also be referred to as the inter-terminal voltage of the reflux MOS 8 or the inter-terminal voltage of the second switching element 8. Here, the inter-terminal voltage Vds may be the same as the detection voltage VDS. Since the drain-source voltage Vds of the ON state reflux MOS 8 has a value obtained by multiplying an ON-resistance Ron by the load current Id, the detection voltage VDS, for example, has a level of about −0.1 to −0.3 V.

Figure 5:
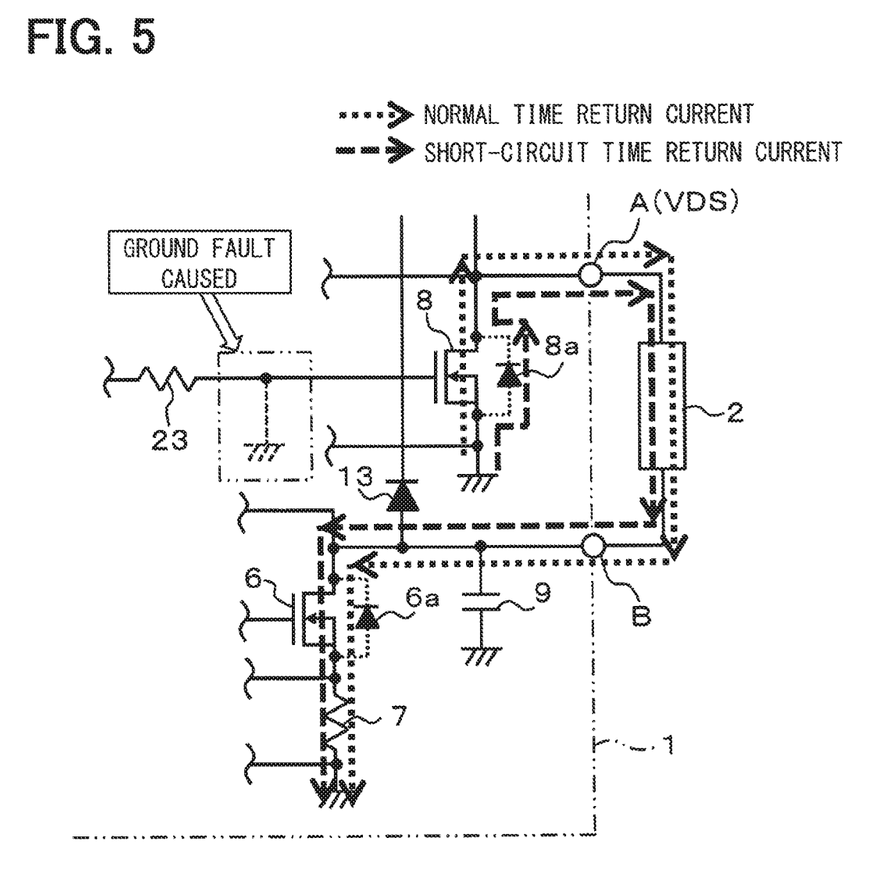
FIG. 5 illustrates operational effects of the load driver.

When the reflux MOS 8 remains in the OFF state when a return current flows, as shown by a dashed line in FIG. 5, a current path is formed from the ground via the parasitic diode 8a of the reflux MOS 8, the solenoid valve 2, the cylinder MOS 6 and the resistor 7. As a result, the solenoid valve 2 continuously receives the load current Id as a return current. At this time, since the voltage drop at the parasitic diode 8a is about −0.7 V, which is the forward voltage Vf, the drain-source voltage Vds obtained from the detection voltage VDS decreases from the ground level by the forward voltage Vf amount to have a negative value.

Thereafter, the load current Id of the solenoid valve 2 gradually decreases, and, when a predetermined time Tp1 elapses, the control circuit 3 drives the reflux MOS 8 to OFF at time t5 as shown in FIG. 4 at (g). Subsequently, as shown in FIG. 4 at (d) and (f), when the constant-current MOS 11 and the backflow prevention MOS 12 are driven to ON by the control circuit 3, both of the MOS 11 and MOS 12 are turned ON at time t6 after the dead time Tx.

After the control circuit controls the discharge MOS 5 to a high voltage power to the electromagnetic solenoid valve 2 from the high-voltage power source VH, the control circuit 3 may drive the constant-current MOS 11 ON a plurality of times for a preset period Ton2 to supply a normal, lower voltage power from the normal power source VB to the electromagnetic solenoid valve 2 to maintain the operation of the electromagnetic solenoid valve 2. In other words, the control circuit 3 is configured to perform a plurality of preset-period (i.e., Ton2) drive maintaining operations of the normal switching element 11 during a power supply cycle for supplying electric power to the electromagnetic valve 2.

As a result, a current path is formed from the DC power source VB via the constant-current MOS 11, the backflow prevention MOS 12, the solenoid valve 2, the cylinder MOS 6, and the resistor 7 to energize the solenoid valve 2. As shown in FIG. 4 at (b), at time t6, when the solenoid valve 2 is energized by the DC power source VB, the load current Id that has been decreasing begins to rise. At this time, the solenoid valve 2 is being energized and maintained in the driven position by the high voltage power source VH.

The control circuit 3 turns OFF the constant-current MOS 11 at time t7 after the solenoid valve 2 is energized by the DC power source VB for a predetermined time Ton2. As a result, the load current Id flowing through the solenoid valve 2 stops due to the cessation of power from the DC power source VB. Due to the inductive nature of the solenoid valve 2, after the constant-current MOS 11 is turned OFF, the load current Id flows from the ground via the path indicated by the dashed line in FIG. 5, that is, through the diode 8a of the reflux MOS 8 in the OFF state. When the load current Id flows through the diode 8a, the detection voltage VDS at the output terminal A becomes a negative potential that is lower than the ground level by an amount of the forward voltage Vf of the diode 8a.

At time t1, after the lapse of the dead time Tx from the turning OFF of the constant-current MOS 11, the control circuit 3 drives the reflux MOS 8 to ON as shown in FIG. 4 at (g). As a result of turning ON the reflux MOS 8, since a current path is formed from the ground through the reflux MOS 8, the solenoid valve 2, the cylinder MOS 6, and the resistor 7, the load current Id, as shown in FIG. 4 at (b), continuously flows through the solenoid valve 2 flows via such a current path.

At this time, the detection voltage VDS at the output terminal A has a negative potential that is lower than the ground level by an amount of the voltage of the ON state reflux MOS 8, that is, the drain-source voltage Vds. Here, the detection voltage VDS is the same as the inter-terminal voltage Vds of the reflux MOS 8 (i.e., the second switching element). Since the drain-source voltage Vds of the ON state reflux MOS 8 is a value obtained by multiplying the ON-resistance Ron by the load current Id, it is about −0.1 to −0.3 V.

Similar to the above-described control operation, the control circuit 3 repeats the control operation from time t5 to t12, for example, by repeating the power supply from the DC power source VB to the solenoid valve 2 three times, for performing a constant current supply to the solenoid valve 2. As a result, the open state of the solenoid valve 2 is maintained during the period when the solenoid valve 2 is energized. Again, time t5 to t12 shows a plurality of preset-period (i.e., Ton2) drive maintaining operations by the normal switching element constant-current MOS 11.

Additionally, as shown in FIG. 4 at (b), a small load current Id can be continuously provided after time t13 similar to the above-described control operation by repeating a short-time power supply from the DC power source VB and then stopping the power supply to maintain a flow of electric current at a predetermined level. This is another example of a plurality of preset-period driving maintaining operations by the normal switching element, constant-current MOS 11.

When the control circuit 3 performs a power supply control on the solenoid valve 2, the control circuit 3 performs a process to control the ON-time for the discharge MOS 5 and the constant-current MOS 11, as described above, as well as determining whether there is an overcurrent flowing in the reflux MOS 8. As such, the power supply control may be considered as a diagnosis or diagnostic detection process. The control circuit 3 carries out the ON-time control process of the discharge MOS 5 and the constant-current MOS 11 at predetermined time intervals. The process for controlling the ON-time of the discharge MOS 5 and the constant-current MOS 11 is described with reference to FIG. 2.

Figure 3:
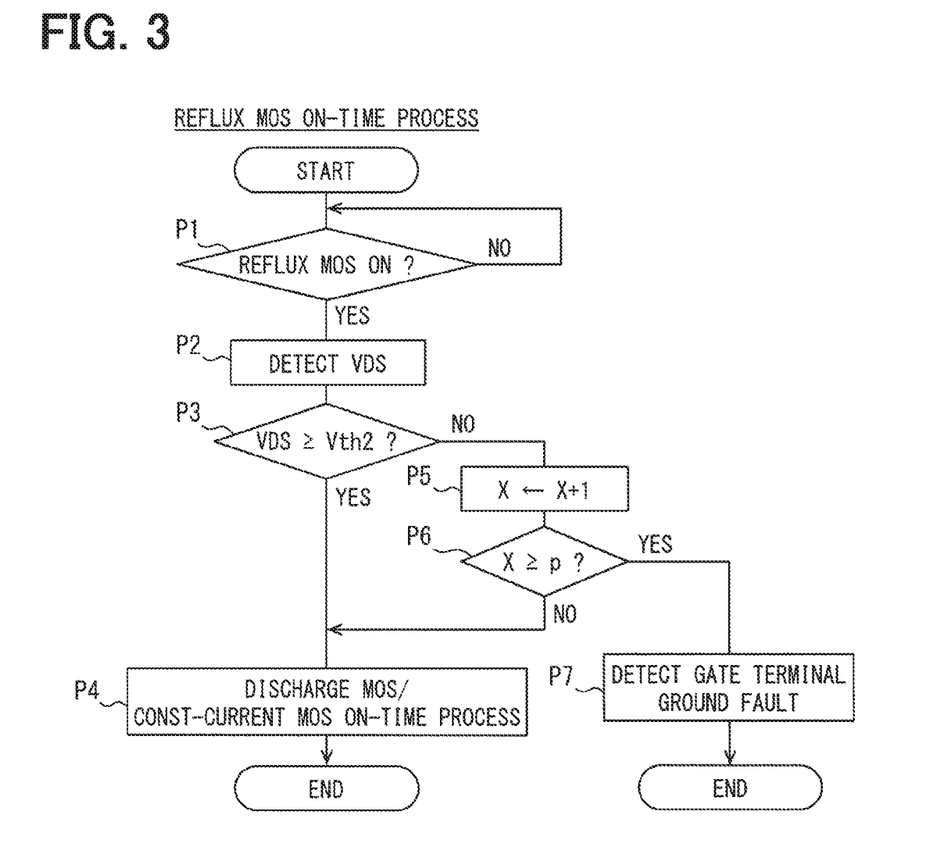
FIG. 3 is another flowchart of the operation of the load driver.

After performing the process to control the ON-time of the discharge MOS 5 and the constant-current MOS 11, the control circuit 3 transitions to a process to control the ON-time of the reflux MOS 8, as shown in FIG. 3. For the process controlling the ON-time of the reflux MOS 8, the control circuit 3 determines whether the reflux MOS 8 is in a gate-ground fault state.

Figure 2:
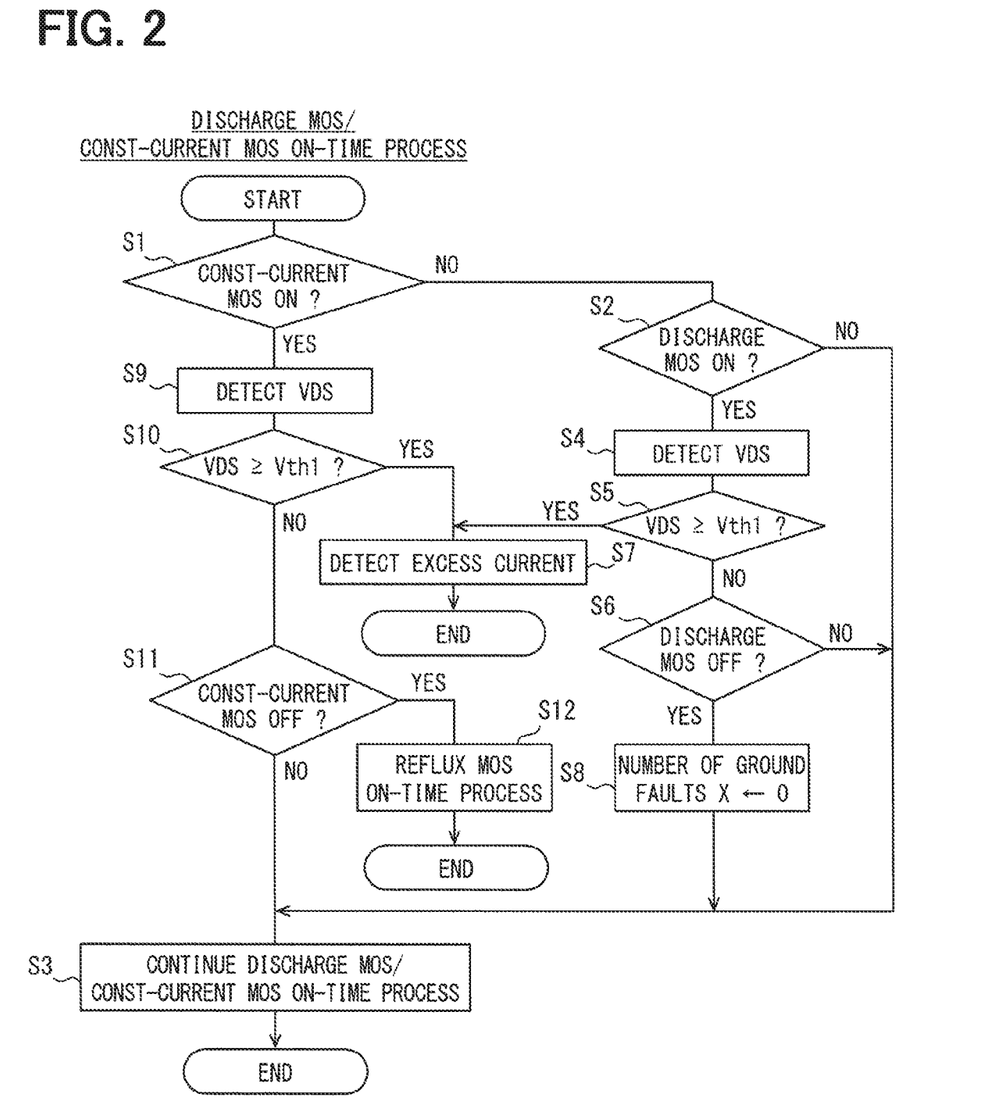
FIG. 2 is a flowchart of an operation of the load driver.

When the control circuit 3 starts the above-described control operation at time t0, the control circuit 3 first performs the ON-time process for the discharge MOS 5 and the constant-current MOS 11 shown in FIG. 2 as the diagnosis detection process. In the following description, reference will also be made to the control period shown in the timing chart of FIG. 4 (e.g., a period from time t1 to time t2).

With reference to FIG. 2, at S1, the control circuit 3 determines whether the constant-current MOS 11 is ON (i.e., in an ON state). If the control circuit 3 determines that the constant-current MOS 11 is not ON, i.e., "NO" at S1, the process proceeds to S2. At S2, the control circuit 3 determines whether the discharge MOS 5 is ON (i.e., in an ON state). When both the constant-current MOS 11 and the discharge MOS 5 are OFF (i.e., during the period from time t0 to time t2), i.e., "NO" at S1 and S2, the process proceeds to S3. At S3, the control circuit 3 continues the ON-time process for the discharge MOS 5 and the constant-current MOS 11. That is, the process flow shown in FIG. 2 is performed again by the control circuit 3 at the beginning of the next control cycle.

When the fuel injection operation is started, the discharge MOS 5 is turned ON. Consequently, the control circuit 3 determines that the discharge MOS 5 is ON, i.e., "YES" at S2, and the process proceeds to S4. At S4, the control circuit 3 detects the detection voltage VDS. Here, when the discharge MOS 5 is turned ON, the electric potential at the output terminal A rises quickly (e.g., a graphical representation of the voltage has a steep slope during this rise time). Such a sharp voltage rise may cause the reflux MOS 8 to turn ON temporarily and cause an overcurrent to flow.

When such a state occurs, the control circuit 3 detects the detection voltage VDS at S4 to detect instances where large currents may flow through the reflux MOS 8 while the reflux MOS 8 is ON. In such cases, large currents flowing through the reflux MOS 8 increase the drain-source voltage Vds (i.e., during a period from time t2 to time t3). The process then proceeds to S5. At S5, the control circuit 3 determines whether the detected detection voltage VDS is equal to or greater than the first threshold voltage Vth1. The first threshold voltage Vth1 is set to a level for determining an overcurrent state in which an overcurrent flows. If the control circuit 3 determines that the detection voltage VDS is not greater than or equal to the first threshold voltage Vth1, i.e., "NO" at S5, the control circuit 3 assumes that no overcurrent is flowing and the process proceeds to S6. If the control circuit 3 makes a "YES" determination at S5, the process proceeds to S7. At S7, the control circuit 3 determines that there is an overcurrent detection state, and the process ends.

At S6, the control circuit 3 determines whether the discharge MOS 5 is turned OFF. When the ON state of the discharge MOS 5 is ongoing, i.e., in progress and continuing, the control circuit 3 determines that the discharge MOS 5 is not OFF, i.e., "NO" at S6, and ends the ON-time process for the discharge MOS 5 and the constant-current MOS 11 after performing the process at S3.

The control circuit 3 performs the above-described overcurrent detection process (i.e., during the period from time t2 to the time t3) by repeatedly performing the ON-time process for the discharge MOS 5 and the constant-current MOS 11 until the discharge MOS 5 is turned OFF. When the discharge MOS 5 is turned OFF, the control circuit 3 determines that the discharge MOS 5 has been turned OFF at S6, i.e., "YES," and the process proceeds to S8. At S8, the control circuit 3 sets a ground fault counter X to zero "0," and the process ends after the control circuit 3 performs the process at S3.

The control circuit 3 turns ON the reflux MOS 8 after the dead time Tx lapses, which causes a return current to flow. Since both the discharge MOS 5 and the constant-current MOS 11 are in the OFF state during such a period (i.e., the period from time t4 to time t5), the control circuit 3 does not perform the overcurrent detection process even when regularly performing the ON-time process for the discharge MOS 5 and the constant-current MOS 11 before ending the process after S1 to S3.

The control circuit 3 turns ON the constant-current MOS 11 and the backflow prevention MOS 12 (i.e., during the Ton2 period from time t6 to time t7) after the dead time Tx (i.e., from time t5 to time t6) by turning OFF the reflux MOS 8. At this time, when the control circuit 3 performs the ON-time process for the discharge MOS 5 and the constant-current MOS 1, the control circuit 3 determines that the constant-current MOS 11 is ON and makes a "YES" determination at S1, and the process then proceeds to S9. At S9, the control circuit 3 detects the detection voltage VDS and the process proceeds to S10. At S10, the control circuit 3 compares the detection voltage VDS with the first threshold voltage Vth1.

Here, similar to the process for the discharge MOS 5, the reflux MOS 8 turns on by itself and the control circuit 3 determines whether there is a fault where there is a temporary flow of overcurrent when the constant-current MOS 11 is turned ON. The control circuit 3 determines whether the detection voltage VDS is equal to or greater than the first threshold voltage Vth1. If the control circuit 3 determines that the detection voltage VDS is not equal to or greater than the first threshold voltage Vth1, i.e., "NO" at S10, the control circuit 3 proceeds to S11. If however the control circuit 3 makes a "YES" determination at S10, the process proceeds to S7. At S7, the control circuit 3 detects any overcurrent and the process then ends.

At S11, the control circuit 3 determines whether the constant-current MOS 11 is turned OFF. When the constant-current MOS 11 remains ON, the control circuit 3 determines that the constant-current MOS 11 is ON, i.e., "NO" at S11, and the process then ends after performing the process at S3.

Thereafter, the control circuit 3 repeatedly performs the ON-time process for the discharge MOS 5 and the constant-current MOS 11, and performs the above-described overcurrent detection process until the constant-current MOS 11 is turned OFF (i.e., during the period from time t6 to time t7). When the constant-current MOS 11 is turned OFF, the control circuit 3 makes a "YES" determination at S11 and the process proceeds to S12. At S12, based on configuration, the control circuit 3 transitions to the ON-time process for the reflux MOS 8.

After the process of FIG. 2, the control circuit 3 turns ON the reflux MOS 8 to allow a return current to flow. During such a period, the control circuit 3 performs the ON-time process for the reflux MOS 8 shown in FIG. 3. At P1, the control circuit 3 waits until the reflux MOS 8 is turned ON. When the reflux MOS 8 is turned ON at time t8, the control circuit 3 detects that the reflux MOS 8 has been turned ON, i.e., "YES" at P1, and the process proceeds to P2. At P2, the control circuit 3 detects the detection voltage VDS and the process proceeds to P3. In other words, for the processes of P1-P3, after the gate-ON drive of reflux MOS 8 (i.e., the second switching element), the control circuit 3 is configured to wait until a preset time lapses before detecting the detection voltage VDS (i.e., in this case the inter-terminal voltage Vds of the reflux MOS 8). At P3, the control circuit 3 determines whether the detection voltage VDS is equal to or greater than the second threshold voltage Vth2. The control circuit 3 is configured to detect the detection voltage VDS a predetermined amount of time after turning ON the reflux MOS 8, to ensure that the detection voltage VDS is in a stable ON state. As described above, when the return current flows, the return current flows through the reflux MOS 8 if the reflux MOS 8 is in the ON state. In this case, the drain-source voltage Vds is derived by multiplying the current value by the ON resistance, and the detection voltage VDS generally takes a value range of about −0.1 V to −0.3 V. On the other hand, in a state in which the reflux MOS 8 not turned ON despite the ON-drive control by the control circuit 3, i.e., in a gate-ground fault state, the return current flows through the parasitic diode 8a. In this case, the drain-source voltage Vds is equivalent to the forward voltage Vf of the diode, and the detection voltage VDS is about −0.7 V.

In such a case, since the return current flows from the ground to the solenoid valve 2 via the ON state reflux MOS 8, the detection voltage VDS is detected as a negative voltage that is lower than the ground level by an amount of the drain-source voltage Vds of the reflux MOS 8. Consequently, the detection voltage VDS takes a higher voltage value than when the reflux MOS 8 is in the OFF state.

For the reasons described above, the second threshold voltage Vth2 is set to an intermediate level voltage in between (i) the voltage value when the reflux MOS 8 is in the ON state and (ii) the voltage value when a current is flowing through the parasitic diode 8a when the reflux MOS 8 is in the OFF state.

When the control circuit 3 determines that the detection voltage VDS is equal to or greater than the second threshold voltage Vth2, i.e., "YES" at P3, the control circuit 3 determines that the reflux MOS 8 is normally performing an ON operation, and the process proceeds to P4. At P4, based on configuration, the control circuit 3 sets the ON-time process for the discharge MOS 5 and the constant-current MOS 11 shown in FIG. 2 as the next process to be performed, and the process shown in FIG. 3 ends.

On the other hand, if the control circuit 3 determines that the detection voltage VDS is not equal to or greater than the second threshold voltage Vth2, i.e., "NO" at P3, the control circuit 3 determines that the reflux MOS 8 is in an abnormal state, i.e., a gate-ground fault state, and the process proceeds to P5. At P5, the control circuit 3 increments the value of the ground fault counter X by one "1." At P6, the control circuit 3 determines whether the value of the ground fault counter X is equal to or greater than a determination value p. If the control circuit 3 determines that the ground fault value is not equal to or greater than the determination value p, i.e., "NO" is determined at P6, the control circuit 3 performs the process at P4 and the ON-time process for the reflux MOS 8 then ends. The determination value p is set to represent the number of detection times for determining a gate-ground fault. In other words, the control circuit 3 is configured to determine the gate-ground fault based on a plurality of detection results (i.e., X) when the plurality of detection results is equal to or exceeds the determination value p (i.e., X≥p). Because the reflux MOS 8 is turned on a plurality of times in one power supply cycle (i.e., when power is supplied to the electromagnetic solenoid valve 2 to drive the valve 2 to open one time), the gate-ground fault determination may be based on the plurality of detection results in one power supply cycle. However, the determination value p may also be set to an amount where the control circuit 3 determines the gate-ground fault based on a plurality of detection results over a plurality of power supply cycles (e.g, over a period where the electromagnetic solenoid valve 2 is driven ON to open multiple times, that is, over multiple power supply cycles).

Thereafter, the control circuit 3 drives the constant-current MOS 11 to ON again after the dead time Tx lapses, by turning OFF the reflux MOS 8 (i.e., during the period from time t10 to time t1). In addition to driving the constant-current MOS 11 to ON, the control circuit 3 performs the ON-time process for the discharge MOS 5 and the constant-current MOS 11 shown in FIG. 2 when the constant-current MOS 11 is turned ON. Then, the constant-current MOS 11 is turned OFF, and the ON-time process for the reflux MOS 8 shown in FIG. 3 is performed again.

At P6, as a result of repeating the ON-time process for the reflux MOS 8, when the control circuit 3 detects that the ground fault state of the gate terminal has occurred at least the same number of times as what has been set as the determination value p, that is, the ground fault state has occurred at least as many times or greater than the determination value p, i.e. "YES" at P6, the process proceeds to P7. At P7, the control circuit 3 determines that the gate terminal of the reflux MOS 8 has a ground fault, and the ON-time process for the reflux MOS 8 then ends.

As described above, in the first embodiment, by setting the drain-source voltage Vds of the reflux MOS 8 to the detection voltage VDS of the output terminal A, the load driving device 1 is configured to detect whether (a) the return current is flowing due to the ON state of the reflux MOS 8, or (b) the return current is flowing through the parasitic diode 8a due to an ON-disabled state of the MOS 8. In such manner, it is possible to perform the overcurrent detection operation and the gate-ground fault detection operation for the reflux MOS 8 by using the existing terminals, that is, without having to add a detection terminal to the control circuit 3.

In the above-described embodiment, during the determination process for determining the gate-ground fault of the reflux MOS 8, the load driving device 1 is configured to obtain the detection voltage VDS when the reflux MOS 8 is turned ON in the state where the return current level is low after the constant-current MOS 11 is turned OFF. Consequently, the voltage difference between the normal state and the abnormal state is greater, and the second threshold voltage Vth2 can be set to an arbitrary level for making such a determination process easier for an accurate detection and determination.

In the above-described embodiment, the determination of the gate-ground fault is made when (i.e., after confirming that) such fault has occurred at least a multiple number of times (i.e., determination value p). In such manner, the accuracy of the detection operation is further improved.

Second Embodiment

Figure 6:
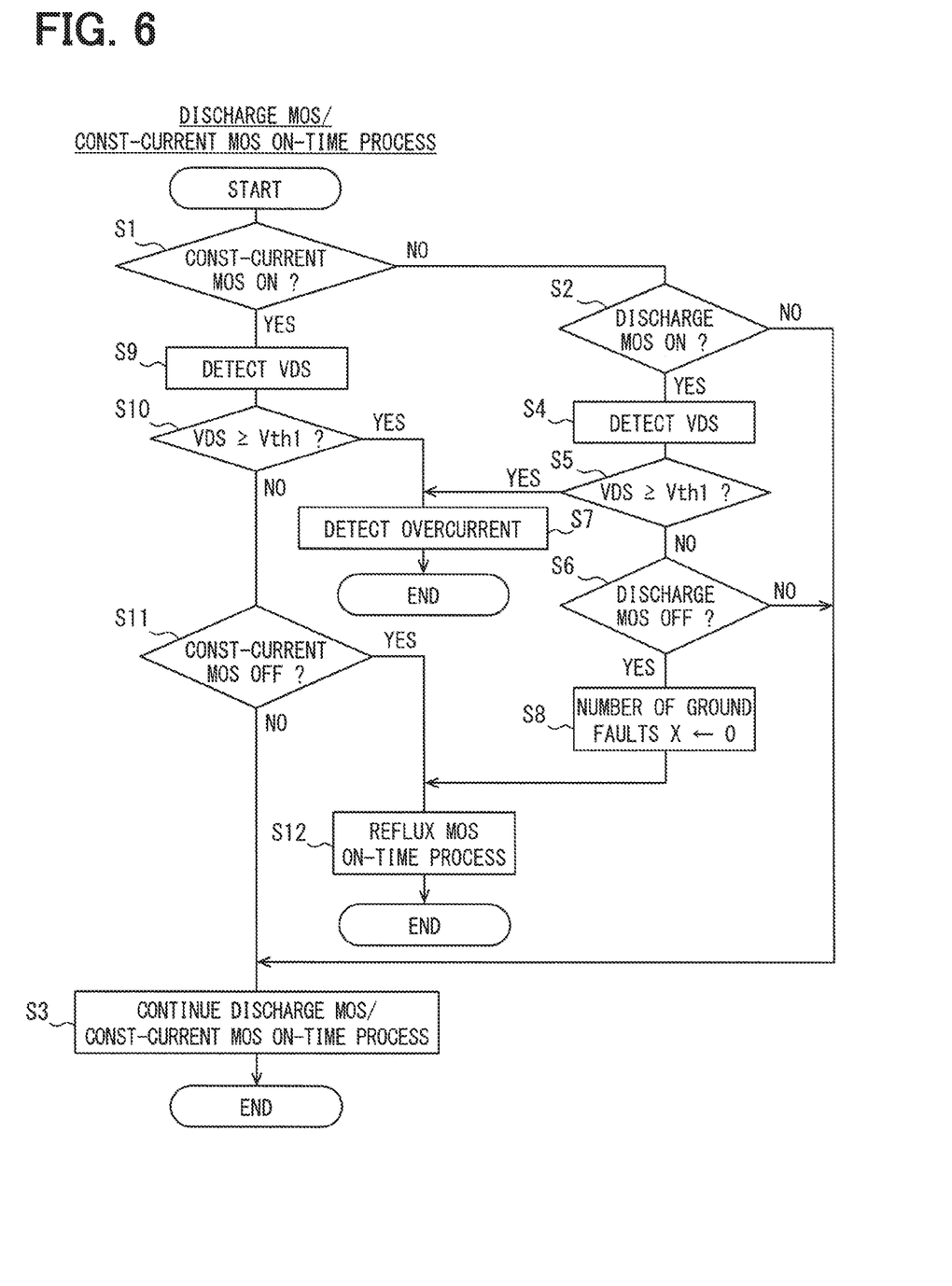
FIG. 6 is a flowchart of an operation of a load driver in a second embodiment of the present disclosure.
Figure 7:
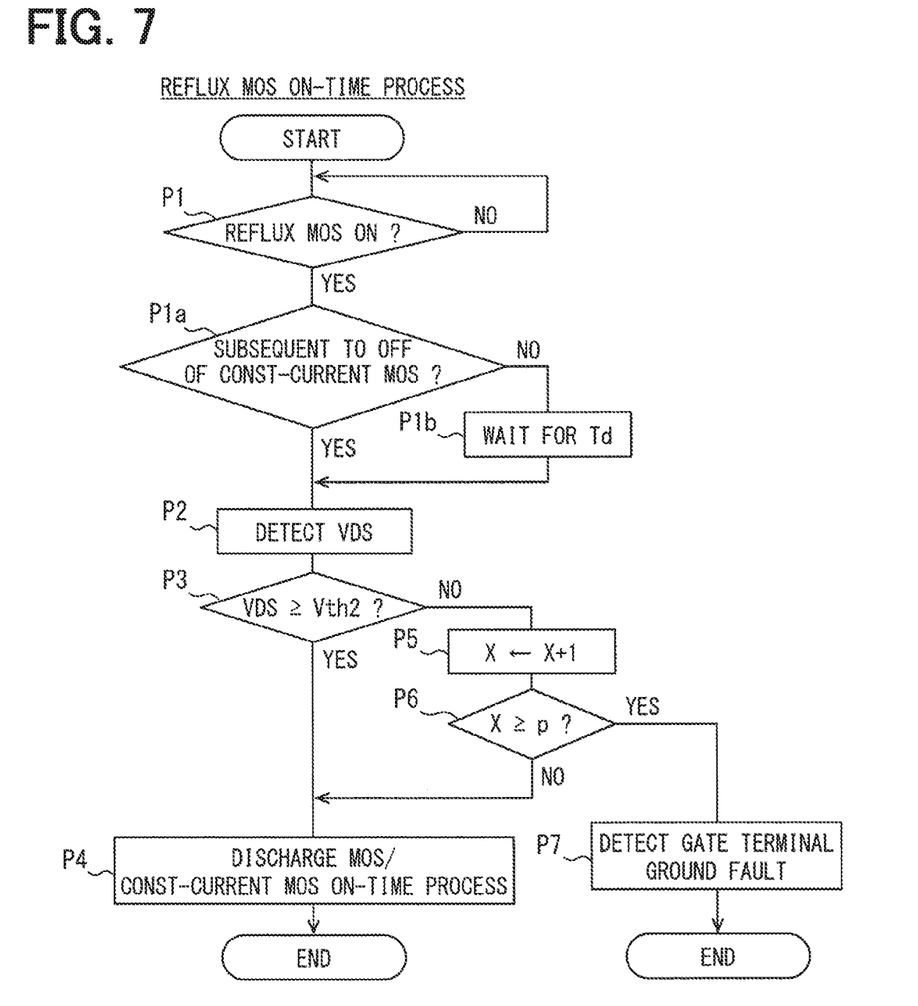
FIG. 7 is another flowchart of the operation of the load driver in the second embodiment.
Figure 8:
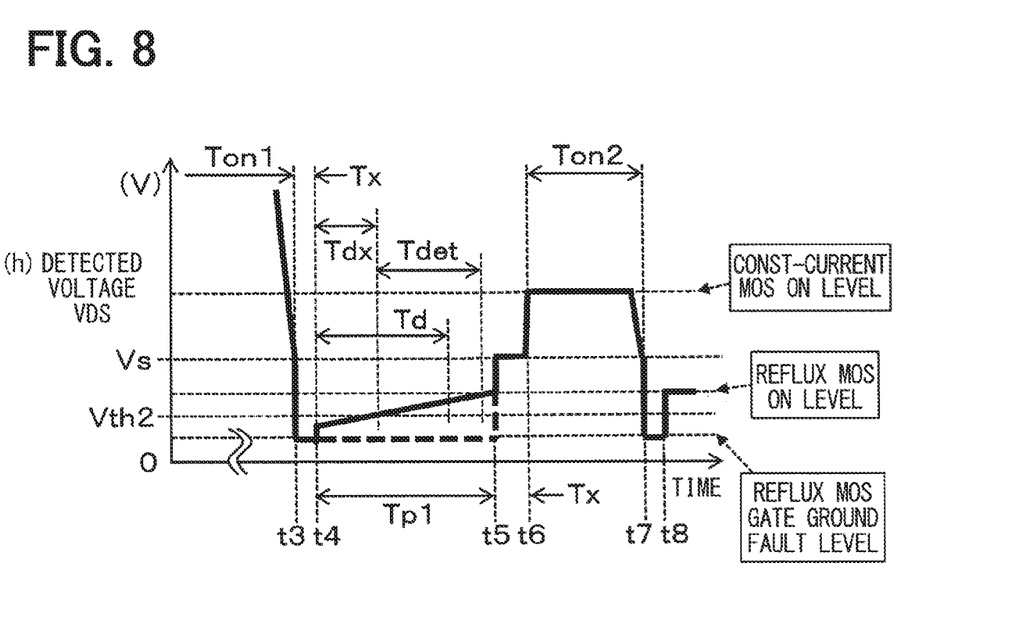
FIG. 8 illustrates operational effects of the load driver in the second embodiment.

FIGS. 6 to 8 show an operation of the load driving device 1 according to the second embodiment. While a repeat description of the processes and operations that are similar to those described above for the first embodiment may be omitted, the portions different from the first embodiment are described below. In the present embodiment, the ON-time process for the reflux MOS 8 is performed even at the time when the reflux MOS 8 is turned ON, after the discharge MOS 5 is turned OFF.

In the present embodiment, the ON-time process for the discharge MOS 5 and the constant-current MOS 11 shown in FIG. 6 is performed in place of the process in the first embodiment shown in FIG. 2. The difference from the first embodiment is that, after the control circuit determines that the discharge MOS 5 is turned OFF at S6, the process proceeds to S12 after performing the process at S8, before transitioning to the ON-time process for the reflux MOS 8.

Another difference from the first embodiment, more specifically the ON-time process for the reflux MOS 8 shown in FIG. 3, is that processes P1a and P1b are added at a position between processes P1 and P2 when the ON-time process for the reflux MOS 8 is performed as shown in FIG. 7. At P1a, the control circuit 3 determines whether the ON operation of the reflux MOS 8 is subsequent to turning OFF of the constant-current MOS 11. If the control circuit 3 determines that the turning ON of the reflux MOS 8 is not subsequent to the turning OFF of the constant-current MOS 11, i.e., "NO" at P1a, the process proceeds to P1b. It may be the case where the reflux MOS 8 is turned ON after turning OFF the discharge MOS 5. At P1b, the process stands by and waits for a predetermined amount of time Td before proceeding to P2. In other words, the control circuit is configured to perform a gate-ground fault determination after the lapse of preset time Td.

The process of the second embodiment shown in FIGS. 6 and 7 are performed taking the following considerations into account. When the constant-current MOS 11 is turned ON, the current flowing through the solenoid valve 2 is relatively small. Consequently, the return current when the constant-current MOS 11 is turned OFF is not very large. As a result, the detection voltage VDS at the output terminal A is in the range of −0.1 to −0.3 V, which corresponds to the drain-source voltage Vds of the reflux MOS 8. In addition, when the reflux MOS 8 is in the OFF state due to a gate-ground fault, the detection voltage VDS is about −0.7 V. Consequently, determining the gate-ground fault can be made more easily and readily by setting the second threshold voltage Vth2 to a level somewhere between detection voltage VDS for the ON/OFF states of the reflux MOS 8 (i.e., between (a) −0.1 V to −0.3 V and (b) −0.7 V).

On the other hand, after turning OFF the discharge MOS 5, the current flowing through the solenoid valve 2 is large and the return current is also large, as shown in FIG. 4 at (b). Such large currents (i) make the drain-source voltage Vds increase in proportion to the return current immediate after turning ON the reflux MOS 8, and (ii) make the detection voltage VDS drop from −0.3 V to be around −0.7 V. Consequently, the settable range for the second threshold voltage Vth2 becomes narrower, making it difficult to accurately detect the gate-ground fault.

As such, in the present embodiment, when performing the ON-time process for the reflux MOS 8, if such a process must be performed after the turning OFF of the discharge MOS 5, the process is configured to wait for a predetermined time Td at P b, before proceeding to P2.

A case where such a wait time Td is set is described with reference to FIG. 8. When the discharge MOS 5 is turned OFF at time t3 and the reflux MOS 8 is turned ON at time t4 after the dead time Tx (i.e., from time t3 to time t4) lapses, the detection voltage VDS has a level near the gate-ground fault level even if the ON operation of the reflux MOS 8 is normally performed. Consequently, in instances where the process for detecting the detection voltage VDS at P2 is performed when the detection voltage VDS is still smaller than the second threshold voltage Vth2, the control circuit 3 may prematurely, that is, falsely or improperly, determine that the detection voltage VDS is less than the second threshold voltage Vth2, i.e., "NO" at P3.

Thereafter, when the return current has sufficiently decreased, if the reflux MOS 8 is normally turned ON, the detection voltage VDS rises to a level equivalent to that of when the constant-current MOS 11 is turned ON, which is significantly greater than the gate-ground fault voltage level.

Taking such an operation into account, there is a detection period Tdet that runs from a time immediately after the period Tdx to time t5. The period Tdx begins at time t4 and is the time required for the detection voltage VDS to rise to the second threshold voltage Vth2. The wait time Td at P1b can be set to an arbitrary period of time as long as it is within (i.e., shorter than) the detection period Tdet.

As a result, the same effects achieved by the first embodiment can also be achieved by the second embodiment. Since the gate-ground fault detection can be performed even when the reflux MOS 8 is turned ON after turning OFF the discharge MOS 5, the detection process can be performed more accurately.

Third Embodiment

Figure 9:
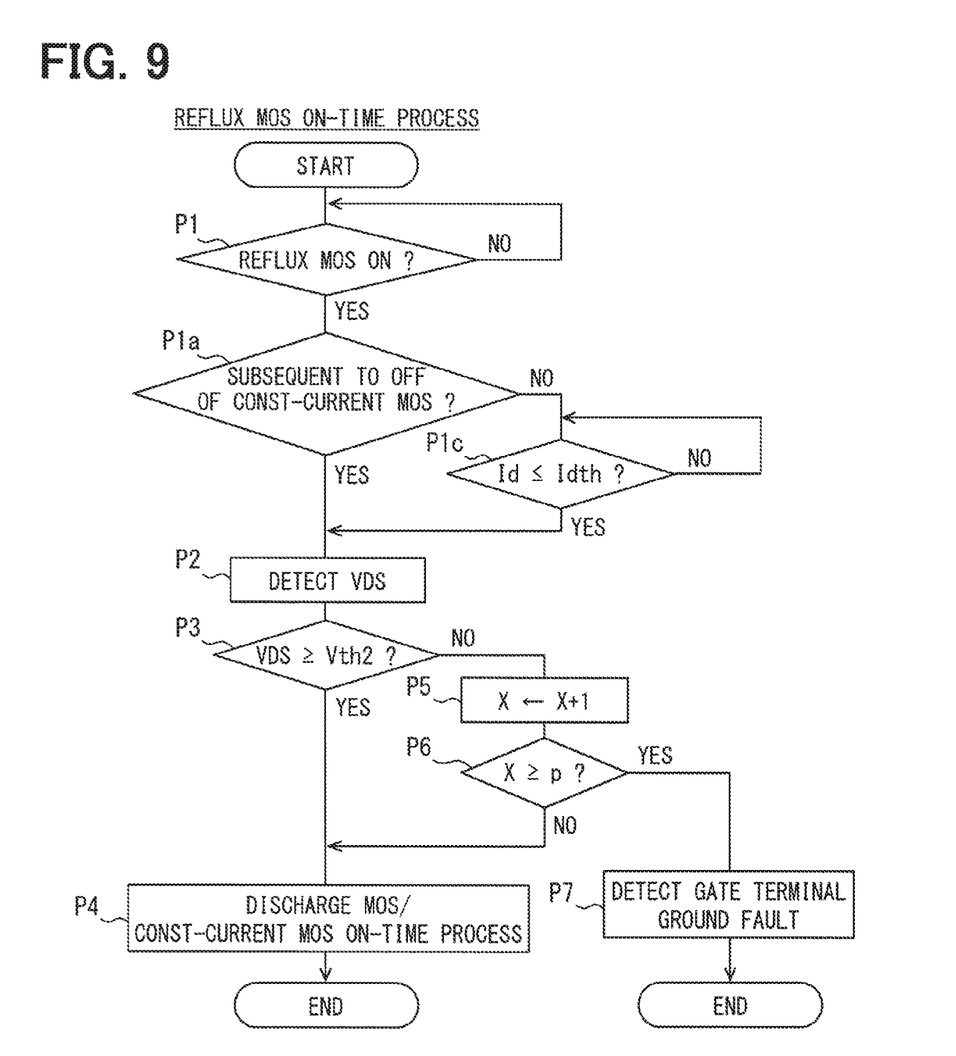
FIG. 9 is a flowchart of an operation of the load driver in a third embodiment of the present disclosure.

FIG. 9 illustrates a third embodiment of the present disclosure, and portions that differ from the previous embodiments are described below in greater detail. In the present embodiment, in instances where the ON-time process for the reflux MOS 8 is performed when the reflux MOS 8 is turned ON after turning OFF the discharge MOS 5, the time when the process at P2 is performed may be adjustably set based on a level of the return current. That is, in the present embodiment, the time when P2 is performed is based on the return current instead of a wait time Td, as described in the second embodiment.

That is, as shown in FIG. 9, in instances where the ON-time process for the reflux MOS 8 is performed, if such process is performed after turning OFF the discharge MOS 5, at P1c, the control circuit 3 waits for the return current Id to fall to a level equal to or less than a threshold current Idth, where the threshold current Idth is set as a predetermined level. In other words, the control circuit may perform the gate-ground fault determination when the return current Id settles to a preset level Idth.

In such a case, the control circuit 3 monitors the value of the return current (i.e., load current) Id by the current detection resistor 7 for the same reason as described in the second embodiment (i.e., premature and thus inaccurate detection of the detection voltage VDS), and waits until the value of Id falls to or below the threshold current Idth at P1c. As a result, the configuration of the third embodiment can achieve the same effects as the previously-described embodiments.

OTHER EMBODIMENTS

The present disclosure should not be limited to the embodiments described above, and various embodiments may further be implemented without departing from the scope of the present disclosure, which includes the modifications and/or expansions described below.

The above embodiments describe instances where the detection voltage VDS may be the same as the source-drain (i.e. inter-terminal) voltage Vds of the reflux MOS 8. In both the ON-time processes for the discharge MOS 5, the constant-current MOS 11, and the reflux MOS 8, for example, as shown in FIGS. 2, 3, 6, 7, and 9, the inter-terminal voltage Vds of the reflux MOS 8 (i.e., the second switching element 8) may be used in place of the detection voltage VDS for determining overcurrent and gate-ground fault conditions. For example, at S4, S5, S9, and S10 in FIGS. 2 and 6, and at P2 and P3 in FIGS. 3, 7, and 9, the detection voltage VDS may be replaced with the inter-terminal voltage Vds of the second switching element 8. This may also include instances where the detection voltage VDS is not equal to the internal-terminal voltage Vds of the second switching element 8.

In the ON-time process for the discharge MOS 5 and the constant-current MOS 11, shown for example in FIGS. 2 and 6, at S5 and S10, the inter-terminal voltage Vds of the reflux MOS 8 (i.e., the second switching element 8) may be compared against the first threshold voltage Vth1 in place of the detection voltage VDS for determining an overcurrent. For example, the comparator 31 in the control circuit 3 may be configured to compare the inter-terminal voltage Vds of the second switching element to the first voltage threshold Vth1. While the inter-terminal voltage Vds of the second switching element 8 may be compared against the first threshold voltage Vth1 (i.e., Vds≥Vth1) for determining an overcurrent, the inter-terminal voltage Vds of the second switching element 8 may be compared against an overcurrent detection voltage when the second switching element is being driven (e.g., the gate-ON drive of the second switching element). The overcurrent detection voltage may be a voltage value equal to the first threshold voltage Vth1, but the overcurrent detection voltage may also be a voltage value different from the first threshold voltage Vth1. The control circuit 3 may be configured to compare both (i) the detection voltage VDS to the first voltage threshold Vth1 and (ii) the inter-terminal voltage Vds of the second switching element 8 when the second switching element 8 is being driven to the overcurrent detection voltage, to determine an overcurrent fault.

In the ON-time process for the reflux MOS 8 shown for example in FIGS. 3, 7, and 9, at P3, the inter-terminal voltage Vds of the reflux MOS 8 (i.e., the second switching element 8) may be compared against the second threshold voltage Vth2 in place of the detection voltage VDS for determining whether the reflux MOS 8 is in a gate-ground fault state (i.e., Vds≥Vth2). As such, the control circuit 3 can determine a gate-ground fault in the second switching element 8 by comparing the inter-terminal voltage Vds of the second switching element 8 to a second threshold voltage Vth2.

In the first embodiment and the second embodiment described above, the gate-ground fault is detected when the reflux MOS 8 is turned ON after turning OFF the constant-current MOS 11. However, the gate-ground fault detection may be performed only when the reflux MOS 8 is turned ON after turning OFF the discharge MOS 5.

In such a case, since the discharge MOS 5 undergoes only one ON operation per fuel injection cycle by the solenoid valve 2, the fault determination may be made when a gate-ground fault is detected over a plurality of fuel injection cycles.

Likewise, even when the gate-ground fault is detected when the reflux MOS 8 is first turned ON after turning OFF the constant-current MOS 11, the fault determination of the gate-ground fault may be made based on the result of the determinations made over a plurality of fuel injection cycles.

The detection of a gate-ground fault when the reflux MOS 8 is first turned ON may be performed at an arbitrary time instead of performing it even time the reflux MOS 8 is turned ON.

Both the discharge MOS 5 and the constant-current MOS 11 are provided separately as the first switching element for energizing the solenoid valve 2, but such a configuration may be modified where only one of the two MOSs may be provided as the first switching element.

Similar to the above-described processes for determining a gate-ground fault in the second switching element, the control circuit 3 may also be configured to determine a gate-ground fault for the first switching element, when the first switching element is configured to function as the constant-current MOS 11 (i.e., the normal switching element 11). For example, the control circuit 3 may determine a gate-ground fault in the constant-current MOS 11 by measuring an inter-terminal voltage of the constant-current MOS 11 and comparing it against a threshold value such as the second threshold voltage Vth2. The control circuit 3 may also determine a gate-ground fault in the constant-current MOS 11 by comparing the detection voltage VDS against a threshold value such as the second threshold voltage Vth2.

Likewise, the control circuit 3 may also be configured to determine a gate-ground fault for the first switching element, when the first switching element is configured to function as the discharge MOS 5 (i.e., the high-voltage switching element 5). For example, the control circuit 3 may determine a gate-ground fault in the discharge MOS 5 by measuring an inter-terminal voltage of the discharge MOS 5 and comparing it against a threshold value such as the second threshold voltage Vth2. The control circuit 3 may also determine a gate-ground fault in the discharge MOS 5 by comparing the detection voltage VDS against a threshold value such as the second threshold voltage Vth2.

In both cases where the control circuit 3 may detect a gate-ground fault in the first switching element (i.e., when the first switching element functions as either the constant-current MOS 11 or the discharge MOS 5), similar to the determination process for the reflux MOS 8 described above, the control circuit 3 may determine gate-ground fault for the discharge MOS 5 and the constant-current MOS 11 either based on a plurality of detection results in one power supply cycle, or based on plurality of detection results over a plurality of power supply cycles. Since the discharge MOS 5 may only be driven (i.e., turn ON) once during a power supply cycle for supplying power to open the electromagnetic solenoid valve 2, the control circuit 3 may base a gate-ground fault determination of the discharge MOS 5 using a plurality of detection results over a plurality of power supply cycles.

In the above-described embodiments, both the first and second switching elements are implemented as MOSFETs, but may be modified to use different switching elements, such as an IGBT (Insulated Gate Bipolar Transistor), so long as the switching elements are gate-drive type switching elements.

The parasitic diode 8a provided as an internal element of the reflux MOS 8 may be replaced with an externally-disposed diode. The overcurrent detection may also be performed by measuring the terminal voltage of the current detection resistor 7.

Though the present disclosure has been described with reference to example embodiments, the present disclosure should not be limited to these examples or the configurations. The present disclosure covers various modification examples and equivalent arrangements. Furthermore, the above embodiments may be modified by various combinations and formations by adding or subtracting one or more elements (e.g., from among the various embodiments), and such modifications are understood as encompassed in the scope of the present disclosure.

What is claimed is:

1. A load driver for driving an electromagnetic valve, the load driver comprising:
   a first switching element of a gate-drive type, the first switching element configured to turn ON and OFF to supply an electric current to the electromagnetic valve;
   a second switching element of a gate-drive type, the second switching element configured to turn ON and OFF to handle a return current from the electromagnetic valve; and
   a control circuit configured to turn the first switching element and the second switching element ON and OFF, and to detect a detection voltage at a terminal of the electromagnetic valve,
   wherein the control circuit is further configured to determine a gate-ground fault in the second switching element when an inter-terminal voltage of the second switching element detected at a time of a gate-ON drive of the second switching element is lower than a second threshold voltage, and
   wherein the control circuit is further configured to determine an overcurrent fault when
      i) the detection voltage is equal to or greater than a first threshold voltage, and
      ii) the inter-terminal voltage of the second switching element is equal to or higher than the overcurrent detection voltage at the time of the gate-ON drive of the second switching element.

2. The load driver of claim 1,
   wherein the control circuit is further configured to determine the gate-ground fault when
      i) no overcurrent fault is detected at the time of the gate-ON drive of the second switching element, and
      ii) the inter-terminal voltage of the second switching element is less than the second threshold voltage.

3. The load driver of claim 1,
   wherein the control circuit is further configured to perform a gate-ground fault determination after a lapse of a preset time from turning OFF the first switching element, subsequent to the gate-ON drive of the second switching element.

4. The load driver of claim 1,
   wherein the control circuit is further configured to perform a gate-ground fault determination when a return current settles to a preset level after turning OFF the first switching element, subsequent to the gate-ON drive of the second switching element.

5. The load driver of claim 3,
   wherein the first switching element is configured as a high-voltage switching element for switching a power supply from a high-voltage power source and a normal switching element for switching a power supply from a normal power source having a voltage that is lower than a voltage of the high-voltage power source, and
   wherein the control circuit is further configured to perform a preset-period ON drive of the high-voltage switching element, and to thereafter perform a plurality of preset-period drive maintaining operations of the normal switching element during a power supply cycle for supplying electric power to the electromagnetic valve, and
   wherein the control circuit is further configured to determine the gate-ground fault for the first switching element, when the first switching element is configured as the normal switching element for switching the power supply from the normal power source.

6. The load driver of claim 5,
   wherein the control circuit is further configured to determine the gate-ground fault based on
      i) a plurality of detection results in one power supply cycle, or
      ii) a plurality of detection results over a plurality of power supply cycles.

7. The load driver of claim 3,
   wherein the first switching element is configured as a high-voltage switching element for switching a power supply from a high-voltage power source and a normal switching element for switching a power supply from a normal power source having a voltage that is lower than a voltage of the high-voltage power source, and
   wherein the control circuit is further configured to perform a preset-period ON drive of the high-voltage switching element, and to thereafter perform a plurality of preset-period drive maintaining operations of the normal switching element during a power supply cycle for supplying electric power to the electromagnetic valve, and
   wherein the control circuit is further configured to determine the gate-ground fault for the first switching element, when the first switching element is configured as the high-voltage switching element for switching the power supply from the high-voltage power source.

8. The load driver of claim 7,
   wherein the control circuit is further configured to determine the gate-ground fault based on a plurality of detection results over a plurality of power supply cycles.

9. The load driver of claim 1,
   wherein the control circuit is further configured to detect the inter-terminal voltage of the second switching element after a lapse of a preset time from the gate-ON drive of the second switching element.

* * * * *